(12) United States Patent
Chiang et al.

(10) Patent No.: US 9,184,097 B2
(45) Date of Patent: Nov. 10, 2015

(54) SEMICONDUCTOR DEVICES AND FORMATION METHODS THEREOF

(75) Inventors: Hsin-Chih Chiang, Hsinchu (TW); Han-Chung Tai, Kaohsiung (TW)

(73) Assignee: SYSTEM GENERAL CORPORATION, Sindian, Taipei County (TW)

( * ) Notice: Subject to any disclaimer, the term of this patent is extended or adjusted under 35 U.S.C. 154(b) by 631 days.

(21) Appl. No.: 12/574,793

(22) Filed: Oct. 7, 2009

(65) Prior Publication Data

US 2010/0230749 A1 Sep. 16, 2010

Related U.S. Application Data

(60) Provisional application No. 61/210,114, filed on Mar. 12, 2009.

(51) Int. Cl.
H01L 21/82 (2006.01)
H01L 21/8238 (2006.01)
H01L 27/092 (2006.01)

(52) U.S. Cl.
CPC .. *H01L 21/823892* (2013.01); *H01L 21/82385* (2013.01); *H01L 21/823857* (2013.01); *H01L 27/0928* (2013.01)

(58) Field of Classification Search
CPC .................................................. H01L 29/1087
USPC .................. 257/213, 337, 668, 501, E21.615, 257/E21.417, E29.256, E27.06; 438/129, 438/337
See application file for complete search history.

(56) References Cited

U.S. PATENT DOCUMENTS

| | | | | |
|---|---|---|---|---|
| 4,300,150 A * | 11/1981 | Colak | ............................ | 257/336 |
| 4,403,395 A * | 9/1983 | Curran | ........................... | 438/234 |
| 4,927,776 A * | 5/1990 | Soejima | ......................... | 438/207 |
| 5,012,322 A * | 4/1991 | Guillotte et al. | ............... | 257/753 |
| 5,021,860 A * | 6/1991 | Bertotti et al. | ................. | 257/552 |
| 5,065,213 A * | 11/1991 | Frisina et al. | .................. | 257/378 |
| 5,163,178 A * | 11/1992 | Gomi et al. | .................... | 257/558 |
| 5,204,541 A * | 4/1993 | Smayling et al. | .............. | 257/138 |
| 5,319,234 A * | 6/1994 | Uga et al. | ....................... | 257/369 |
| 5,422,508 A * | 6/1995 | Yilmaz et al. | .................. | 257/370 |
| 5,471,085 A * | 11/1995 | Ishigaki et al. | ................. | 257/370 |
| 5,495,124 A * | 2/1996 | Terashima | ..................... | 257/550 |
| 5,501,994 A * | 3/1996 | Mei | ................................ | 438/200 |
| 5,504,368 A * | 4/1996 | Sawada | ........................... | 257/556 |
| 5,517,046 A * | 5/1996 | Hsing et al. | .................... | 257/336 |
| 5,591,657 A * | 1/1997 | Fujishima et al. | ............. | 438/202 |
| 5,631,487 A * | 5/1997 | Hattori | ........................... | 257/394 |
| 5,637,889 A * | 6/1997 | Groover et al. | ................ | 257/192 |
| 5,643,809 A * | 7/1997 | Lien | ............................... | 438/234 |

(Continued)

*Primary Examiner* — Mohammad Islam
*Assistant Examiner* — Ankush Singal
(74) *Attorney, Agent, or Firm* — McClure, Qualey & Rodack, LLP

(57) ABSTRACT

A semiconductor device is provided and includes a substrate of a first conductivity type, a deep well of a second conductivity type, and a first high-side device. The deep well is formed on the substrate. The first high-side device is disposed within the deep well and includes an insulation layer of the second conductivity type, a well of the first conductivity type, first and second regions of the second conductivity type, and a first poly-silicon material. The insulation layer is formed on the substrate. The well is formed within the deep well. The first and second regions are formed within the well. The first poly-silicon material is disposed between the first region and the second region and on the deep well.

14 Claims, 5 Drawing Sheets

(56) References Cited

U.S. PATENT DOCUMENTS

| | | | |
|---|---|---|---|
| 5,648,281 A * | 7/1997 | Williams et al. | 438/358 |
| 5,852,314 A * | 12/1998 | Depetro et al. | 257/343 |
| 5,907,171 A * | 5/1999 | Santin et al. | 257/315 |
| 5,943,564 A * | 8/1999 | Chen et al. | 438/202 |
| 5,953,600 A * | 9/1999 | Gris | 438/200 |
| 6,137,153 A * | 10/2000 | Le et al. | 257/532 |
| 6,194,764 B1 * | 2/2001 | Gossner et al. | 257/355 |
| 6,238,959 B1 * | 5/2001 | Tung | 438/197 |
| 6,245,609 B1 * | 6/2001 | Tsai et al. | 438/234 |
| 6,255,713 B1 * | 7/2001 | Chi | 257/526 |
| 6,281,565 B1 * | 8/2001 | Yoshitake | 257/590 |
| 6,303,419 B1 * | 10/2001 | Chang et al. | 438/202 |
| 6,303,961 B1 * | 10/2001 | Shibib | 257/335 |
| 6,376,891 B1 * | 4/2002 | Nagatani et al. | 257/492 |
| 6,440,812 B2 * | 8/2002 | Violette | 438/369 |
| 6,569,742 B1 * | 5/2003 | Taniguchi et al. | 438/303 |
| 6,605,844 B2 * | 8/2003 | Nakamura et al. | 257/360 |
| 6,677,198 B2 * | 1/2004 | Hsu et al. | 438/257 |
| 6,717,206 B2 * | 4/2004 | Hsu et al. | 257/316 |
| 6,729,886 B2 * | 5/2004 | Efland et al. | 438/207 |
| 6,750,489 B1 * | 6/2004 | Merrill | 257/292 |
| 6,815,794 B2 * | 11/2004 | Shin et al. | 257/500 |
| 6,844,578 B2 * | 1/2005 | Harada et al. | 257/278 |
| 6,878,996 B2 * | 4/2005 | Rothleitner | 257/341 |
| 6,879,003 B1 * | 4/2005 | Cheng et al. | 257/355 |
| 6,949,424 B2 * | 9/2005 | Springer | 438/202 |
| 7,049,663 B2 * | 5/2006 | Wang | 257/335 |
| 7,091,079 B2 * | 8/2006 | Chen et al. | 438/199 |
| 7,161,198 B2 * | 1/2007 | Omi et al. | 257/288 |
| 7,195,965 B2 * | 3/2007 | Lin et al. | 438/202 |
| 7,304,387 B2 * | 12/2007 | Chang et al. | 257/760 |
| 7,329,570 B2 * | 2/2008 | Lee | 438/199 |
| 7,394,133 B1 * | 7/2008 | Vashchenko et al. | 257/355 |
| 7,411,271 B1 * | 8/2008 | Ma et al. | 257/547 |
| 7,489,007 B2 * | 2/2009 | Williams et al. | 257/335 |
| 7,528,032 B2 * | 5/2009 | Hasegawa et al. | 438/238 |
| 7,608,895 B2 * | 10/2009 | Williams et al. | 257/368 |
| 7,635,621 B2 * | 12/2009 | McCormack et al. | 438/202 |
| 7,704,819 B2 * | 4/2010 | Huang et al. | 438/199 |
| 7,714,390 B2 * | 5/2010 | Cottin et al. | 257/358 |
| 7,719,064 B2 * | 5/2010 | Wu et al. | 257/409 |
| 7,755,147 B2 * | 7/2010 | Satoh | 257/371 |
| 7,834,400 B2 * | 11/2010 | Huang | 257/355 |
| 7,843,002 B2 * | 11/2010 | Wei et al. | 257/335 |
| 7,902,600 B2 * | 3/2011 | Lin et al. | 257/335 |
| 7,906,808 B2 * | 3/2011 | Matsudai et al. | 257/328 |
| 8,063,444 B2 * | 11/2011 | Chang | 257/343 |
| 2001/0013610 A1 * | 8/2001 | Chi et al. | 257/197 |
| 2002/0030238 A1 * | 3/2002 | Nakamura et al. | 257/409 |
| 2002/0053710 A1 * | 5/2002 | Io | 257/408 |
| 2002/0079514 A1 * | 6/2002 | Hower et al. | 257/200 |
| 2002/0106860 A1 * | 8/2002 | Nishibe et al. | 438/305 |
| 2002/0109202 A1 * | 8/2002 | Chen et al. | 257/499 |
| 2002/0179977 A1 * | 12/2002 | Wong et al. | 257/371 |
| 2002/0182805 A1 * | 12/2002 | Hsu et al. | 438/257 |
| 2002/0185673 A1 * | 12/2002 | Hsu et al. | 257/314 |
| 2002/0190308 A1 * | 12/2002 | Hsu et al. | 257/316 |
| 2003/0173624 A1 * | 9/2003 | Choi et al. | 257/368 |
| 2004/0152288 A1 * | 8/2004 | Trogolo et al. | 438/514 |
| 2004/0251492 A1 * | 12/2004 | Lin | 257/335 |
| 2005/0006701 A1 * | 1/2005 | Sung et al. | 257/339 |
| 2005/0082565 A1 * | 4/2005 | Menard et al. | 257/119 |
| 2005/0106825 A1 * | 5/2005 | You et al. | 438/301 |
| 2005/0179092 A1 * | 8/2005 | Ko | 257/370 |
| 2005/0221551 A1 * | 10/2005 | Ueda et al. | 438/199 |
| 2005/0258453 A1 * | 11/2005 | Springer | 257/205 |
| 2006/0006462 A1 * | 1/2006 | Chang et al. | 257/341 |
| 2006/0065947 A1 * | 3/2006 | Ojala | 257/531 |
| 2006/0113592 A1 * | 6/2006 | Pendharkar et al. | 257/335 |
| 2006/0124999 A1 * | 6/2006 | Pendharkar | 257/335 |
| 2006/0255850 A1 * | 11/2006 | Luk et al. | 327/208 |
| 2007/0132033 A1 * | 6/2007 | Wu et al. | 257/371 |
| 2007/0181909 A1 * | 8/2007 | Rozsypal | 257/109 |
| 2007/0249135 A1 * | 10/2007 | Chuang et al. | 438/309 |
| 2007/0252731 A1 * | 11/2007 | Chung | 341/50 |
| 2007/0275509 A1 * | 11/2007 | Yoo et al. | 438/129 |
| 2008/0036027 A1 * | 2/2008 | Chiang et al. | 257/500 |
| 2008/0061867 A1 * | 3/2008 | Kaya | 327/535 |
| 2008/0128756 A1 * | 6/2008 | Satoh | 257/203 |
| 2008/0138946 A1 * | 6/2008 | Lee | 438/200 |
| 2008/0173949 A1 * | 7/2008 | Ma et al. | 257/371 |
| 2008/0191291 A1 * | 8/2008 | Wu et al. | 257/409 |
| 2008/0237703 A1 * | 10/2008 | Lin et al. | 257/336 |
| 2008/0237777 A1 * | 10/2008 | Hu et al. | 257/500 |
| 2008/0277728 A1 * | 11/2008 | Huang | 257/357 |
| 2008/0293202 A1 * | 11/2008 | Shiraki et al. | 438/270 |
| 2009/0001461 A1 * | 1/2009 | Ko | 257/343 |
| 2009/0014791 A1 * | 1/2009 | Anderson et al. | 257/337 |
| 2009/0152668 A1 * | 6/2009 | Sone et al. | 257/501 |
| 2009/0166721 A1 * | 7/2009 | Denison et al. | 257/328 |
| 2009/0212373 A1 * | 8/2009 | Karino et al. | 257/369 |
| 2009/0236679 A1 * | 9/2009 | Chiang et al. | 257/483 |
| 2010/0027172 A1 * | 2/2010 | Liu et al. | 361/56 |
| 2010/0032756 A1 * | 2/2010 | Pendharkar et al. | 257/337 |
| 2010/0148250 A1 * | 6/2010 | Lin et al. | 257/335 |
| 2010/0151648 A1 * | 6/2010 | Yu et al. | 438/300 |
| 2010/0213987 A1 * | 8/2010 | Takahashi et al. | 327/109 |
| 2011/0133818 A1 * | 6/2011 | Matsudai et al. | 327/534 |
| 2011/0254097 A1 * | 10/2011 | Noguchi et al. | 257/368 |

* cited by examiner

SEMICONDUCTOR DEVICES AND FORMATION METHODS THEREOF

CROSS REFERENCE TO RELATED APPLICATIONS

The present application claims the benefit of U.S. provisional application entitled "SEMICONDUCTOR STRUCTURE FOR HIGH-SIDE DEVIDES INTEGRATED WITH LOW SIDE DEVICEW", Ser. No. 61/210,114, filed Mar. 12, 2009.

BACKGROUND OF THE INVENTION

1. Field of the Invention

The invention relates to a semiconductor device, and more particularly to a new high-side device integrated with an original low-side device.

2. Description of the Related Art

A variety of power suppliers and motor drivers utilize bridge circuits to control a power source to a load. The bridge circuit normally has a high-side transistor connected to the power source and a low-side transistor connected to the ground. A common node between the high-side transistor and the low-side transistor is coupled to the load. As the transistors are controlled to alternately conduct, the voltage of the common node swings between voltage levels of the power source and the ground. Therefore, a high-side transistor driver requires a charge pump circuit and/or a floating drive circuit in order to fully turn on the high-side transistor. In recent development, many floating circuits are being disclosed in U.S. Pat. No. 6,344,959 (Milazzo), U.S. Pat. No. 6,781,422 (Yang) and U.S. Pat. No. 6,836,173 (Yang).

FIG. 1 shows a high-side transistor drive circuit. A floating circuit 10 is applied to control the on/off state of a high-side transistor 11. An NMOS transistor 12 is connected to receive a control signal $S_1$ through an inverter 13 in a low-side circuit. The NMOS transistor 12 comprises a drain region 120 coupled to an inverter 17 of the floating circuit 10. The high-side transistor 11 is coupled to a low-side transistor 14 at a common node where an output voltage $V_O$ is generated. A charge-pump capacitor 15 provides a supply voltage to the floating circuit 10. A voltage $V_D$ charges the charge-pump capacitor 15 through a diode 16 once the low-side transistor 14 is turned on according to a control signal $S_2$. The ground reference of the charge-pump capacitor 15 is pulled to the level of a voltage source $V_{IN}$ when the high-side transistor 11 is turned on.

FIG. 2 shows a top view of a conventional semiconductor device of the high-side inverter 17 and the low-side inverter 13 shown in FIG. 1. The integrated circuit includes a high-side region 2 to form high-side devices, such as the high-side inverter 17. A barrier 170 is disposed between the high-side region 2 and a low-side region 3.

The drain region 120 of the NMOS transistor 12 is coupled to an NMOS transistor 20 and a PMOS transistor 21 of the high-side region 2 through a high-side conduction line 22, and a gate region of the NMOS transistor 12 is coupled to an NMOS transistor 30 and a PMOS transistor 31 of the low-side region 3.

FIG. 3 shows a cross view of a conventional semiconductor structure of the semiconductor device shown in FIG. 2. The NMOS transistor 12 is disposed in an N-type well 102. An $N^+$ conductivity type region forms the drain region (D) 120, another $N^+$ conductivity type region forms a source region (S) 121, and a poly-silicon material between the drain region 120 and the source region 121 forms a gate electrode (G) 122. Wherein the gate electrode 122 is disposed above oxides 123 for controlling the current flow in the conduction channel. The high-side devices comprise the NMOS transistor 20 and the PMOS transistor 21 to serve as the high-side inverter 17. In the NMOS transistor 20, an $N^+$ conductivity type region is disposed in a P-type well 204 as a source region (S) 200, another $N^+$ conductivity type region disposed in an N-type region 201 (N-type Double diffusion region, wherein the $N^+$ conductivity type region has a heavy diffusion concentration, and the N-type region 201 has a light diffusion concentration) forms a drain region (D) 202, and a poly-silicon material between the drain region 202 and the source region 200 forms a gate electrode (G) 203. For the PMOS transistor 21, a $P^+$ conductivity type region is disposed in the N-type well 102 as a source region (S) 210, another $P^+$ conductivity type region disposed in a P-type region 211 (P-type Double diffusion region, wherein the $P^+$ conductivity type region has a heavy diffusion concentration, and the P-type region 211 has a light diffusion concentration) forms a drain region (D) 212, and a poly-silicon material between the drain region 212 and the source region 210 forms a gate electrode (G) 213. The P-type well barrier 170 is composed of a $P^+$ conductivity type region 171. A P diffusion region 172 is disposed in the N-type well 102. The high-side conduction line (500V) 22 is coupled across the P-type well barrier 170.

The low-side devices comprise the NMOS transistor 30 and the PMOS transistor 31 to serve as the low-side inverter 13. The NMOS transistor 30 and the PMOS transistor 31 are disposed in the deep N-type well 102. The NMOS transistor 30 comprises an $N^+$ conductivity type region as a drain region (D) 40, and another $N^+$ conductivity type region disposed in a P-type well 41 as a source region (S) 42. A poly-silicon material between the drain region 40 and the source region 42 forms a gate electrode (G) 43. The PMOS transistor 31 comprises a $P^+$ conductivity type region as a source region (S) 50, and another $P^+$ conductivity type region disposed in a P-type well 51 as a drain region (D) 52. A poly-silicon material between the drain region 52 and the source region 50 forms a gate electrode 53.

The drawback of the conventional semiconductor structure is that the operation voltage of the high-side conduction line is lower because dielectric breakdown voltage between high-side conduction line 22 and the metal of the barrier 170 (Metal-to-Metal dielectric breakdown voltage) is 500 V. The operation voltage of the NMOS transistor 20 is 15V. Higher dielectric breakdown voltage and operation voltage is appreciated.

BRIEF SUMMARY OF THE INVENTION

An exemplary embodiment of a semiconductor device comprises a substrate of a first conductivity type, a deep well of a second conductivity type, and a first high-side device. The deep well of a second conductivity type is formed on the substrate. The first high-side device is disposed within the deep well and comprises an insulation layer of the second conductivity type, a well of the first conductivity type, first and second regions of the second conductivity type, and a first poly-silicon material. The insulation layer of the second conductivity type is formed on the substrate. The well of the first conductivity type is formed within the deep well. The first and second regions of the second conductivity type are formed within the well. The first poly-silicon material is disposed between the first region and the second region and on the deep well.

An exemplary embodiment a method for forming a semiconductor device comprises steps: forming a substrate of a first conductivity type; forming a layer of a second conductivity type on the substrate; forming a deep well of the second conductivity type, wherein the deep well is extended down from a surface of the substrate; forming a well of the first conductivity type from the surface of the substrate, wherein the well is disposed within the deep well and on the layer; disposing a first poly-silicon material on the deep-well; and forming first and second regions of the second conductivity type within the well.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
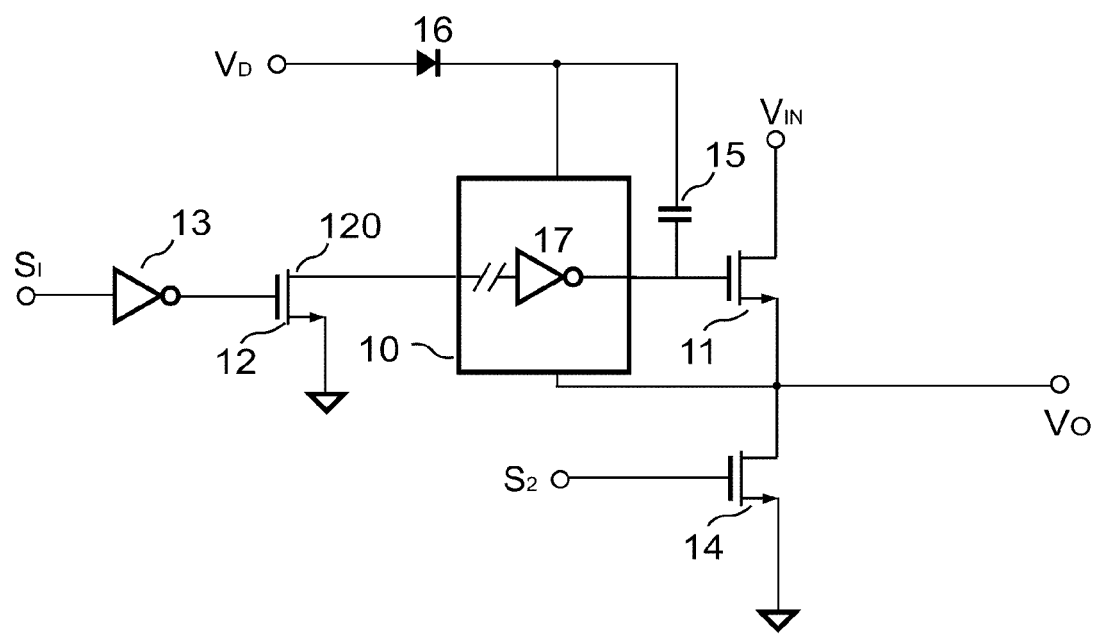
FIG. 1 shows a high-side transistor drive circuit.
Figure 2:
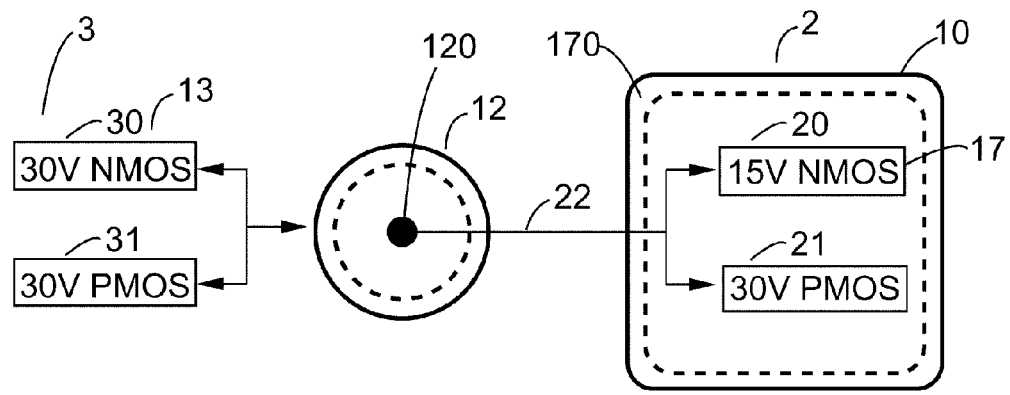
FIG. 2 shows a top view of a conventional semiconductor device of the high-side inverter and the low-side inverter shown in FIG. 1.
Figure 4:
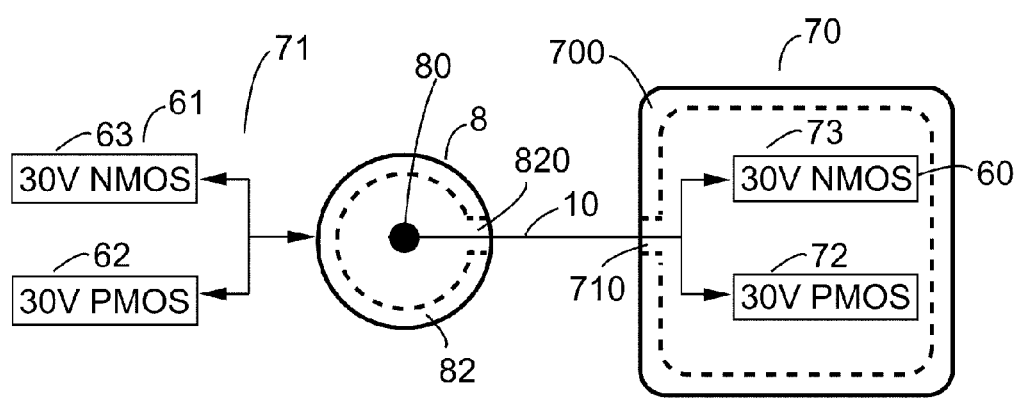
FIG. 4 is a top view of a semiconductor device for a high-side device and a low-side devices of an exemplary embodiment.
Figure 3:
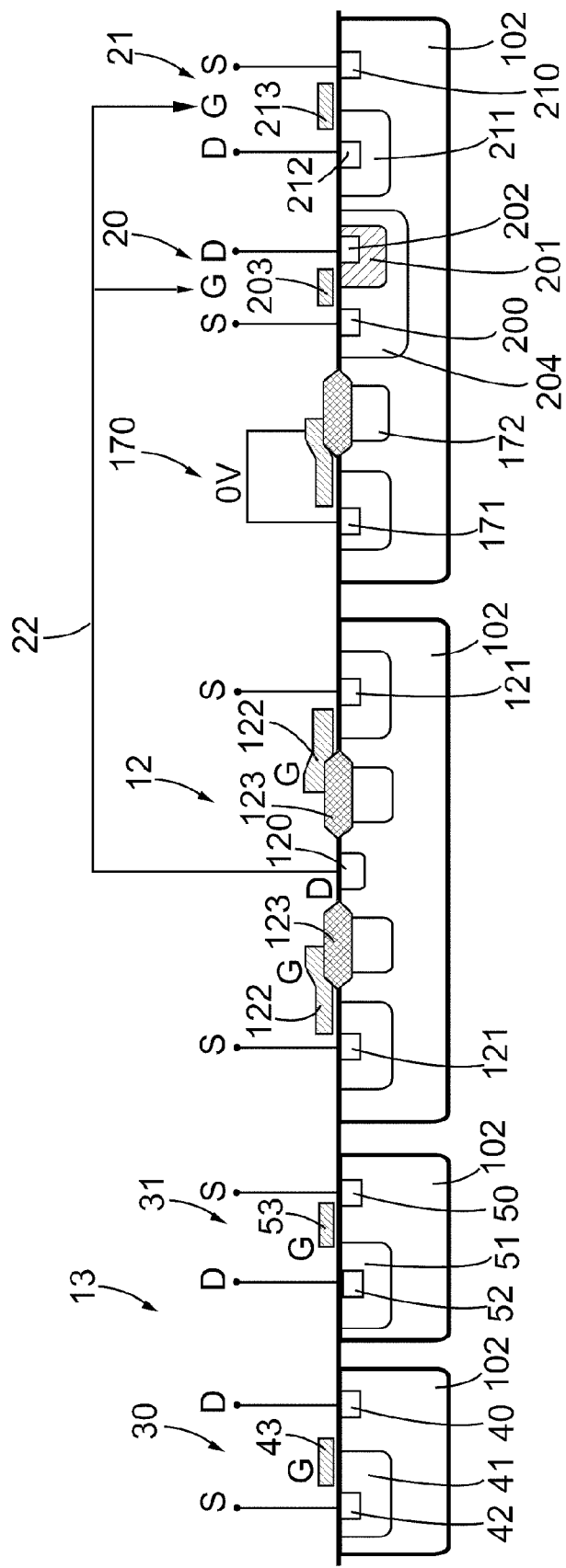
FIG. 3 shows a cross view of a conventional semiconductor structure of the semiconductor device shown in FIG. 2.
Figure 5:
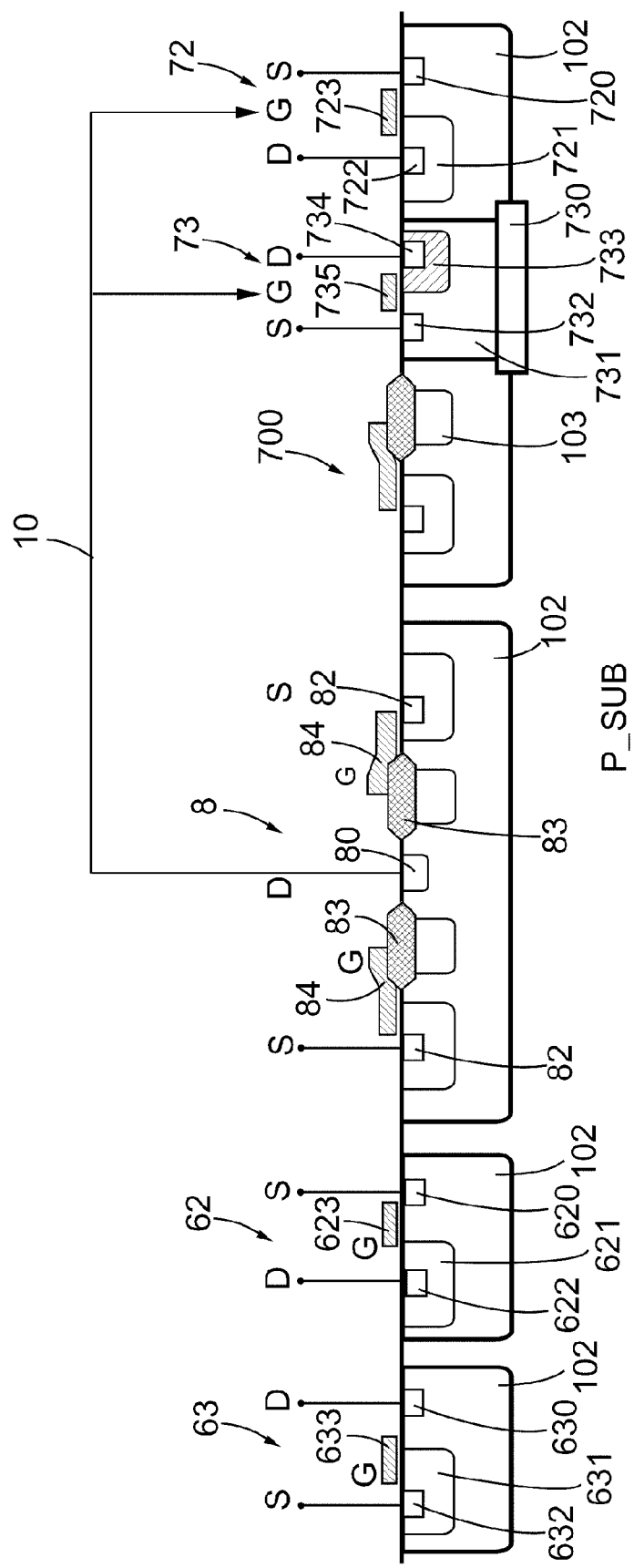
FIG. 5 show a cross section view of the semiconductor device shown in FIG. 4.

FIG. 4 is a top view of a semiconductor device for a high-side device (inverter) 60 and a low-side device (inverter) 61 of an exemplary embodiment. FIG. 5 shows a cross-section view of the semiconductor device according to an exemplary embodiment. Referring to FIG. 4, the semiconductor device comprises a high-side region 70 to form the high-side device, such as a high-side inverter 60 in the embodiment. A barrier 700 is disposed between the high-side region 70 and a low-side region 71. The barrier 700 has an open area 710 which is formed under a high-side conduction line 10.

A drain region 80 of an NMOS transistor 8 is coupled to an NMOS transistor 73 and a PMOS transistor 72 of the high-side region 70 through the high-side conduction line 10, and a gate region of the NMOS transistor 8 is coupled to an NMOS transistor 63 and a PMOS transistor 62 of the low-side region 71. A source region 82 of the NMOS transistor 8 has an opening 820 which is formed corresponding to the path of the high-side conduction line 10.

FIG. 5 shows a cross section view of the semiconductor device shown in FIG. 4. The NMOS transistor 8 is disposed in an N-type well 102. An N+ conductivity type region forms the drain region (D) 80, another N+ conductivity type region forms the source region (S) 82, and a poly-silicon material disposed between the drain region 80 and the source region 82 forms a gate electrode (G) 84. Wherein the gate electrode 84 is disposed above oxides 83 for controlling the current flow in the conduction channel.

The high-side devices 60 comprise the NMOS transistor 73 and the PMOS transistor 72. In the NMOS transistor 73, an N+ conductivity type layer 730 is disposed on the P substrate P_SUB for insulation, which is define an insulation layer in the embodiment, and a P− conductivity type region is formed on the N+ conductivity type layer 730 as a deep P-type well 731. An N+ conductivity type region disposed in the N+ conductivity type layer 730 forms a source region (S) 732, another N+ conductivity type region disposed in an N-type region 733 (N-type Double diffusion region, wherein the N+ conductivity type region has a heavy diffusion concentration, and the N-type region 733 has a light diffusion concentration) forms a drain region (D) 734, and a poly-silicon material disposed between the drain region 734 and the source region 732 forms a gate electrode 735. For the PMOS transistor 72, a P+ conductivity type region is disposed in the N-type well 102 as a source region (S) 720 (third region), another P+ conductivity type region disposed in a P-type region (fifth region) 721 (P-type Double diffusion region, wherein the P+ conductivity type region has a heavy diffusion concentration, and the P-type region 721 has a light diffusion concentration) forms a drain region (D) (fourth region) 722, and a poly-silicon material disposed between the drain region 722 and the source region 720 forms a gate electrode 723. As shown in FIG. 4, a P diffusion region 103 forms the P-type well barrier 700 disposed in the N-type well 102. The high-side conduction line 10 which is disposed above the opening 820 and the open area 710 is coupled to the gate regions 723 and 735 of the PMOS transistor 72 and the NMOS transistor 73.

The low-side device 61 comprises the NMOS transistor 63 and the PMOS transistor 62 to serve as a low-side inverter. The NMOS transistor 63 and the PMOS transistor 62 are disposed in the deep N-type well 102. The NMOS transistor 63 comprises an N+ conductivity type region as a drain region (D) 630, and another N+ conductivity type region disposed in a P-type well 631 as a source region (S) 632. A poly-silicon material between the drain region 630 and the source region 632 forms a gate electrode (G) 633. The PMOS transistor 62 comprises a P+ conductivity type region as a source region (S) 620, and another P+ conductivity type region disposed in a P-type well 621 as a drain region (D) 622. A poly-silicon material between the source region 620 and the drain region 622 forms a gate electrode (G) 623.

According to the aforementioned description, the semiconductor device of the embodiment has a deeper P-type well 731 for the NMOS transistor 73, so the operation voltage of the high-side NMOS transistor 73 is increased, such as 30V in the embodiment. Besides, the opening 820 and the open area 710 are formed under the high-side conduction line 10, so that the operation voltage of the high-side conduction line 10 is increased to 700V due to higher metal-to-poly breakdown voltage.

Figure 6:
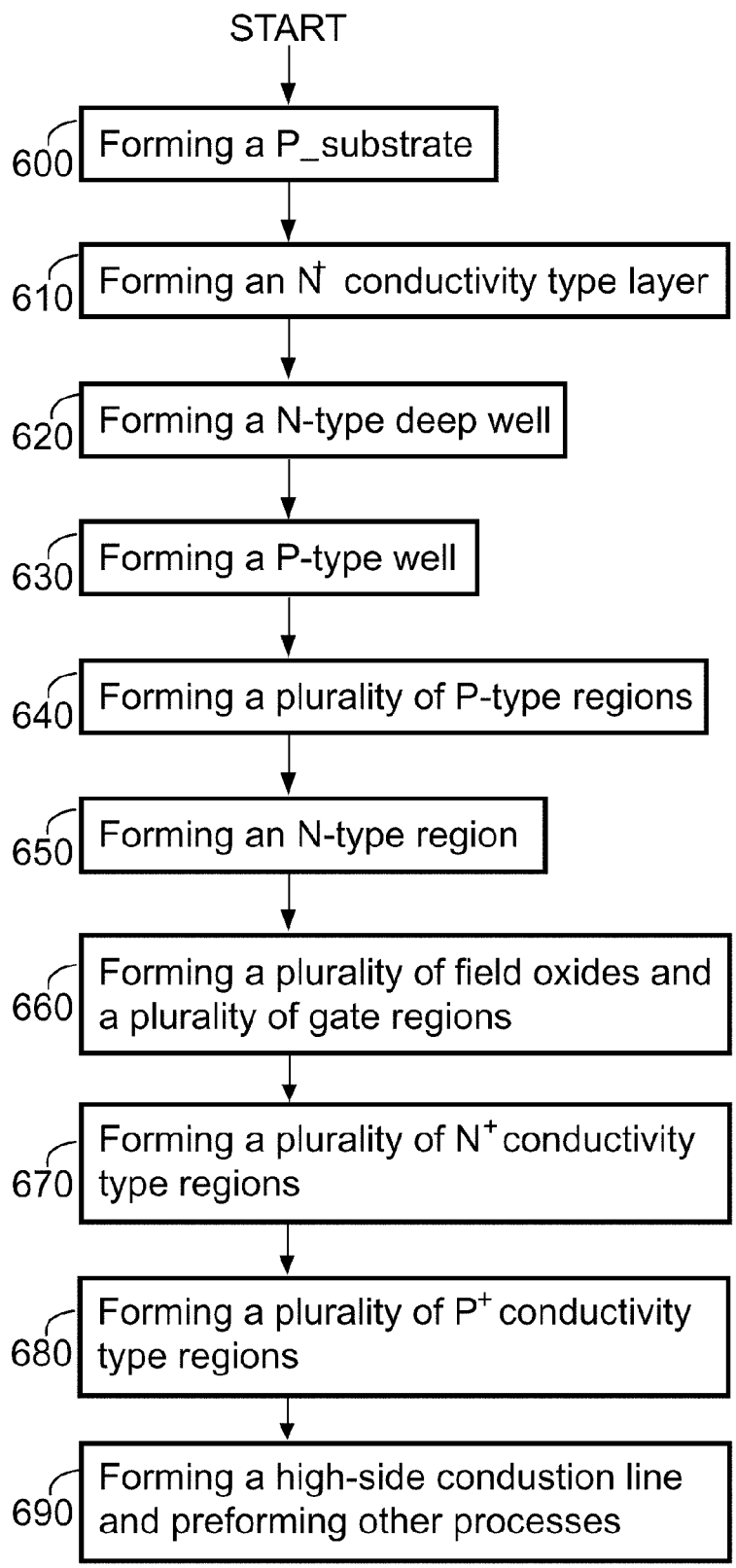
FIG. 6 is flow chart of a method for forming the semiconductor device in the embodiment with FIG. 5.

The following will describe the flow of a method for forming the semiconductor device in the embodiment with FIG. 5. Referring to FIG. 6, first, a substrate having a first conductive type, such as a P-substrate P_SUB is formed (step 600). A layer having a second conductive type, such as N+ conductivity type layer 730 is formed on the P substrate P_SUB (step 610). The layer 730 is formed within the P-substrate P_SUB. Then, a deep well having a second conductive type, such as N-type deep well 102, is extended down from a surface of the P-substrate P_SUB (step 620). A deep well having a first conductive type, such as P-type well 731, is then formed from a surface of the P-substrate P_SUB (step 630). Wherein the P-type well 731 is disposed within the N-type deep well 102 and on the N+ conductivity type layer 730. Thus, the N+ conductivity type layer 730 provides isolation between the P substrate P_SUB and the P-type well 731. Next, in step 640, a plurality of first doping regions (such as P-type regions 721, 103, 621, 631) are formed within the N-type deep well 102. Then, a second doping region (such as an N-type region 733) is formed in the P-type well 731 (step 650). Next, field oxides 83 is formed on the N-type deep well 102, and the gate regions 723, 735, 84, 623, 633 are formed on the N-type deep well 102 thereafter (step 660). Next, the N$^+$ conductivity type regions 732, 734, 82, 630 and 632 are formed within the P-type well 731, N-type region 733, N-type deep well 102, and P-type region 631, respectively (step 670). Next, the P$^+$ conductivity type regions 722, 720, 620 and 622 are formed within the P-type well 721, N-type deep well 102, N-type deep well 102, and P-type region 621, respectively (step 680). Subsequent processes, such as connecting a high-side conduction line 10 between the drain region (D) 80 and the NMOS transistor 73 and PMOS transistor 72, and other processes, are preformed to finish the semiconductor manufacture (step 690).

In the embodiment, the N$^+$ conductivity type source region 732, the N$^+$ conductivity type drain region 734, and the gate electrode 735 form a high-side device, such as the NMOS transistor 73 in FIG. 4. The P$^+$ conductivity type source region 720, the P$^+$ conductivity type drain region 722, and the gate electrode 723 form another high-side device, such as the PMOS transistor 72 in FIG. 4.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device comprising:
    a substrate of a first conductivity type;
    a deep well of a second conductivity type, formed on the substrate; and
    a first high-side device, disposed within the deep well and comprising:
    a layer of the second conductivity type, formed on the substrate, wherein the layer is in direct contact with the substrate;
    a well of the first conductivity type, formed within the deep well, wherein the well is in direct contact with the layer and fully separated from the substrate by the layer;
    first and second regions of the second conductivity type, formed within the well, wherein each of the first and second regions are fully separated from the layer by the well; and
    a first poly-silicon material, disposed between the first region and the second region and on the deep well,
    wherein a normal prosection area of the layer with respect to the substrate is larger than a normal projection area of the well with respect to the substrate.

2. The semiconductor device as claimed in claim 1, wherein the first high-side device further comprises a third region of the second conductivity type formed in the well and between the second region and the well.

3. The semiconductor device as claimed in claim 2, wherein the second region and the third region form a double diffusion region.

4. The semiconductor device as claimed in claim 1 further comprising a second high-side device disposed within the deep well and comprising:
    third and fourth regions of the first conductivity type, formed within the deep well; and
    a second poly-silicon material, disposed between the third region and the fourth region and on the deep well.

5. The semiconductor device as claimed in claim 4, wherein the second high-side device further comprises a fifth region of the first conductivity type formed in the deep well and between the fourth region and the deep well.

6. The semiconductor device as claimed in claim 5, wherein the fourth region and the fifth region form a double diffusion region.

7. The semiconductor device as claimed in claim 1 further comprising:
    a high-side transistor coupled between a voltage source and a common node; and
    a low-side transistor coupled between the common node and a ground, wherein the first high-side device is applied to control a state of the high-side transistor.

8. A method for manufacturing a semiconductor structure, comprising:
    forming a substrate of a first conductivity type;
    forming a layer of a second conductivity type on the substrate, wherein the layer is in direct contact with the substrate;
    forming a deep well of the second conductivity type, wherein the deep well is extended down from a surface of the substrate;
    forming a well of the first conductivity type from the surface of the substrate, wherein the well is disposed within the deep well and on the layer, and the well is in direct contact with the layer and fully separated from the substrate by the layer;
    disposing a first poly-silicon material on the deep well; and
    forming first and second regions of the second conductivity type within the well, wherein each of the first and second regions are fully separated from the layer by the well,
    wherein a normal projection area of the layer with respect to the substrate is larger than a normal projection area of the well with respect to the substrate.

9. The method as claimed in claim 8 further comprising:
    forming a third region of the second conductivity in the well and between the second region and the well.

10. The method as claimed in claim 9, wherein the second region and the third region form a double diffusion region.

11. The method as claimed in claim 8 further comprising:
    forming third and fourth regions of the first conductivity type within the deep-well; and
    disposing a second poly-silicon material, formed between the third region and the fourth region and on the deep well.

12. The method as claimed in claim 11 further comprising:
    forming a fifth region of the first conductivity in the deep well and between the fourth region and the deep well.

13. The method as claimed in claim 12, wherein the fourth region and the fifth region form a double diffusion region.

14. The method as claimed in claim 11, wherein the first region, the second region, and the first poly-silicon material form a first high-side device, and the third region, fourth region, and the second poly-silicon material form a second high-side device.

* * * * *